United States Patent [19]
Tihanyi

[11] Patent Number: 5,834,954
[45] Date of Patent: Nov. 10, 1998

[54] INTEGRATED COMPARATOR CIRCUIT

[75] Inventor: Jenoe Tihanyi, Kirchheim, Germany

[73] Assignee: Siemens Aktiengesellschaft, Munich, Germany

[21] Appl. No.: 679,251

[22] Filed: Jul. 12, 1996

[30] Foreign Application Priority Data

Jul. 12, 1995 [DE] Germany ............. 195 25 427.9

[51] Int. Cl.$^6$ .................................................. H03K 5/153
[52] U.S. Cl. ............................. 327/77; 327/78; 327/80; 327/81
[58] Field of Search ....................... 327/50, 56, 60, 327/77, 78, 80, 81, 108, 112

[56] References Cited

U.S. PATENT DOCUMENTS

| | | | |
|---|---|---|---|
| 4,160,176 | 7/1979 | Takahashi | 307/362 |
| 5,345,111 | 9/1994 | Fong | 307/350 |
| 5,434,521 | 7/1995 | Leipold et al. | 327/78 |
| 5,467,039 | 11/1995 | Bae | 327/198 |

FOREIGN PATENT DOCUMENTS 41 38 860  6/1993  Germany .

*Primary Examiner*—Timothy P. Callahan
*Assistant Examiner*—An T. Luu
*Attorney, Agent, or Firm*—Herbert L. Lerner; Laurence A. Greenberg

[57] ABSTRACT

An integrated comparator circuit includes a first terminal and a second terminal for an operating voltage. An input stage has two complementary MOSFETS having main current paths connected in series defining a common connecting point therebetween. The two MOSFETS have gate terminals connected to the common connecting point. The series circuit of the MOSFETS is connected between the first terminal and a third terminal. An inverter stage has two complementary MOSFETS having main current paths connected in series defining a common connecting point therebetween forming an output terminal. The two complementary MOSFETS have gate terminals connected to the common connecting point of the input stage. The second terminal and the third terminal receive an input signal of the comparator circuit. A fourth terminal is provided for application of a reference potential to determine a switching threshold of the comparator circuit. The reference potential has a level between potentials of the first terminal and the second terminal. The series circuit of the MOSFETs of the inverter stage is connected between the first terminal and the fourth terminal. Each of the MOSFETs of the same channel type are identical.

5 Claims, 3 Drawing Sheets

INTEGRATED COMPARATOR CIRCUIT

BACKGROUND OF THE INVENTION

FIELD OF THE INVENTION

The invention relates to an integrated comparator circuit having: a first terminal and a second terminal for an operating voltage; an input stage with two complementary MOSFETS which are connected with their main current paths in series and have a common connecting point; the series circuit of the MOSFETs is connected between the first terminal and a third terminal; the gate terminals of the two MOSFETs are connected to the common connecting point; an inverter stage has two complementary MOSFETs which are connected with their main current paths in series and have a common connecting point that forms an output terminal; the gate terminals of the two MOSFETs are connected to the common connecting point of the input stage; and an input signal of the comparator circuit is intended for connection between the second terminal and the third terminal.

One such comparator circuit is described, for instance, in German patent DE 41 38 860 C1, corresponding to U.S. Pat. No. 5,434,521. The series circuit of the MOSFETs of the inverter stage is connected between the two terminals for the operating voltage. A voltage divider ratio of the two complementary MOSFETs of the input stage in that known comparator circuit is chosen in such a way that the following inverter stage, where $U_e=0$ volts, furnishes an H level at its outputs with its two complementary MOSFETs. Conversely, if a positive voltage $U_e$ is applied to the input terminals of the input stage of the comparator circuit, then the potential at the output of the input stage shifts in the direction of higher values, causing the output voltage $U_e$ of the inverter stage to drop to the L level. In order to establish a defined response threshold of that known comparator circuit for $U_e > 0$ V, the transfer characteristic curve of whichever MOSFET of the input stage is being acted upon by the input signal and of the MOSFET of the same channel type as the inverter stage must be chosen to be different from one another. Those MOSFETs must therefore necessarily be constructed differently from one another. Moreover, that kind of different structure of the MOSFETs results in an increased sensitivity to temperature and interference.

However, the known comparator circuit has the decisive advantage of requiring no current sources or resistors and of being made up solely of MOSFETs.

Comparator circuits are generally used to detect a voltage referred to a reference potential. As soon as the voltage to be detected exceeds a predetermined value, which is known as the threshold value, a signal that indicates the surpassing of the threshold value can be picked up at the output of the comparator. Conversely, if the input voltage of the comparator fails to attain the threshold value, the output of the comparator outputs a different output signal, so that the undershooting of the threshold value is likewise unambiguously signaled at the output of the comparator. In comparator circuits, it is often necessary to detect low voltages even in the millivolt range, even though very high voltages may prevail at the measurement point. That is especially true for self-insulating power Ics.

A basic circuit diagram of a power switch is also shown as an example in FIG. 1, which is described in detail below. As mentioned below, it is necessary for a comparator circuit of the power switch to be able to withstand high voltage when turning off a power MOSFET, without suffering damage.

In order to solve that problem, previously known CMOS comparator circuits with protection components have been used at the input of the comparator circuit.

SUMMARY OF THE INVENTION

It is accordingly an object of the invention to provide an integrated comparator circuit, which overcomes the hereinafore-mentioned disadvantages of the heretofore-known devices of this general type and which is simpler in structure, is distinguished by high invulnerability to temperature, can detect very low voltages, and nevertheless has a high electric strength or pronounced voltage endurance, as compared to previously known comparator circuits.

With the foregoing and other objects in view there is provided, in accordance with the invention, an integrated comparator circuit comprising a first terminal and a second terminal for an operating voltage; an input stage having two complementary MOSFETS, the two MOSFETS having main current paths connected in series defining a common connecting point therebetween, and the two MOSFETS having gate terminals connected to the common connecting point; a third terminal, the series circuit of the MOSFETs being connected between the first terminal and the third terminal; an inverter stage having two complementary MOSFETs, the two complementary MOSFETs having main current paths connected in series defining a common connecting point therebetween forming an output terminal, and the two complementary MOSFETs having gate terminals connected to the common connecting point of the input stage; the second terminal and the third terminal receiving an input signal of the comparator circuit; a fourth terminal for application of a reference potential to determine a switching threshold of the comparator circuit, the reference potential having a level between potentials of the first terminal and the second terminal; the series circuit of the MOSFETs of the inverter stage being connected between the first terminal and the fourth terminal; and each of the MOSFETs of the same channel type being identical.

In accordance with another feature of the invention, the MOSFET of the input stage having one channel type and being connected to the third terminal and the MOSFET of the inverter stage having the same channel type are high-threshold MOSFETs, and in each of the high-threshold MOSFETs an existing drain terminal is connected as a source terminal and an existing source terminal is connected as a drain terminal.

In accordance with a further feature of the invention, the potential applied to the first terminal is a positive voltage potential, and the potential applied to the second terminal is a lower reference potential, in particular zero potential.

In accordance with an added feature of the invention, the potential applied to the second terminal is a positive voltage potential, and the potential applied to the first terminal is a lower reference potential, in particular zero potential.

In accordance with an additional feature of the invention, there is provided a Zener diode connected between the second terminal and the connecting point of the input stage.

In accordance with yet another feature of the invention, there is provided at least one further inverter stage (and optionally a plurality of identical inverter stages) following the first-mentioned inverter stage and having identical MOSFETs being complementary to the MOSFETs of the first-mentioned inverter stage.

In accordance with a concomitant feature of the invention, the MOSFETs connected to the first terminal are logic transistors.

Other features which are considered as characteristic for the invention are set forth in the appended claims.

Although the invention is illustrated and described herein as embodied in an integrated comparator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
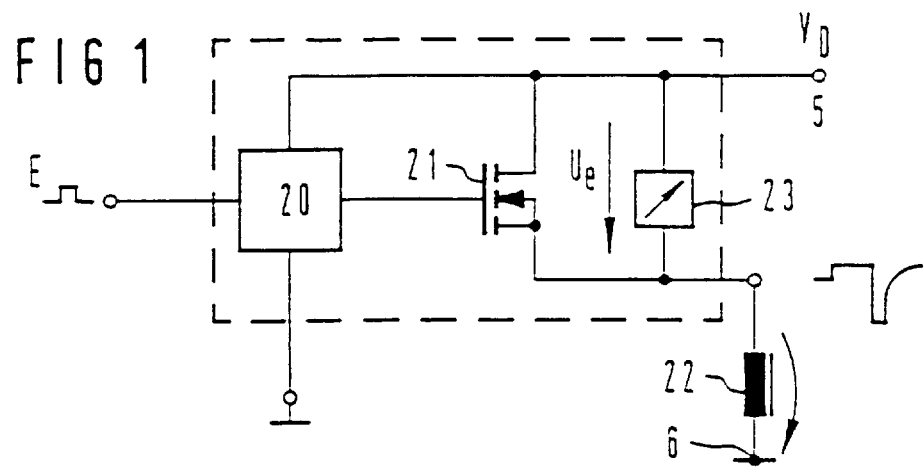
FIG. 1 is a schematic and block circuit diagram of a known power switch device.

Referring now in detail to the figures of the drawings, in which unless otherwise noted, the same reference numerals identify identical elements with the same meaning and first, particularly, to FIG. 1 thereof, there is seen, as an example, a basic circuit diagram of a power switch, in which a power switch element, which is a power MOSFET 21 in the illustrated example, is connected in series with an inductive load 22. The series circuit of the power MOSFET 21 and the inductive load 22 is located between terminals 5, 6 of an operating voltage, with the positive potential applied to the terminal 5 and a zero potential applied to the terminal 6. A control terminal of the power MOSFET 21 is triggered with input control pulses E through a control circuit 20 having supply voltage terminals connected to the terminals 5 and 6. In order to measure a voltage drop along the main current path of the power MOSFET, a comparator circuit 23 is connected parallel to the main current path of the power MOSFET 21. The comparator circuit 23 must on one hand be capable of detecting very low voltages when the power MOSFET 21 is turned on, because in the ON state a voltage $U_e$ is in the millivolt range. Conversely, because of the inductive load, the voltage $U_e$ attains a very high negative value upon turnoff. It is therefore necessary that the comparator circuit 23 also be able to withstand this high voltage during the process of turning off the power MOSFET, without suffering damage. As mentioned above, in order to solve this problem, previously known CMOS comparator circuits with protection components have been used at the input of the comparator circuit.

Figure 2:
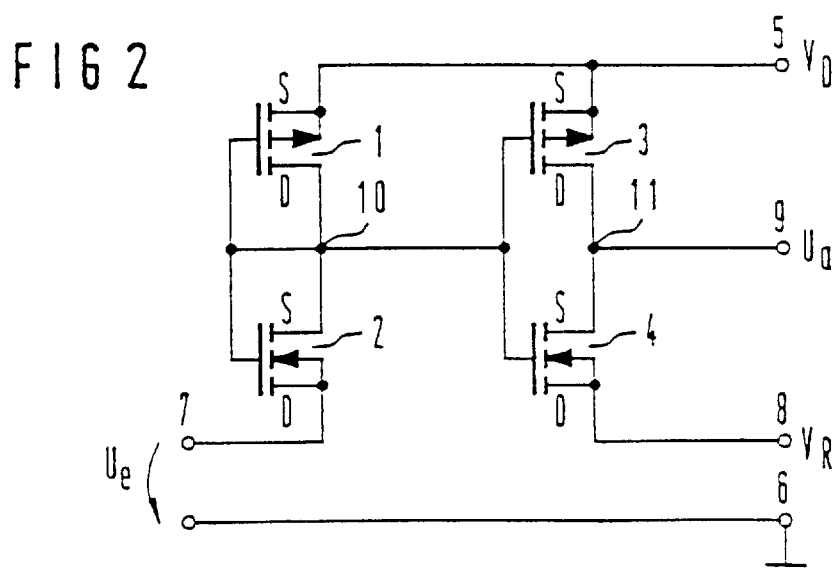
FIG. 2 is a schematic diagram of a first circuit configuration of an integrated comparator circuit according to the invention.

An integrated comparator circuit of FIG. 2 includes an input stage with one p-channel MOSFET 1 and one n-channel MOSFET 2. The two MOSFETs 1, 2 are connected with their main current paths in series and have a common connecting point 10. A first terminal 5 for a positive potential $V_D$ of an operating voltage is connected to a source terminal of the p-channel MOSFET 1. A second terminal 6 for the operating voltage is applied to reference potential, in this case zero potential. Gate terminals of the MOSFETs 1, 2 are connected to the connecting point 10. A terminal of the n-channel MOSFET 2 that is not applied to the connecting point 10 is connected to a third terminal 7. The input voltage $U_e$ to be detected is to be applied between the second terminal 6 and the third terminal 7. The connecting point 10 is connected to gate terminals of a p-channel MOSFET 3 and an n-channel MOSFET 4 of an inverter stage. Main current paths of these MOSFETs 3, 4 are connected in series and likewise have a common connecting point 11, which at the same time forms an output terminal 9 of the comparator circuit. A source terminal of the p-channel MOSFET 3 is applied to the first terminal 5. A terminal of the n-channel MOSFET 4 that is not connected to the common connecting point 11 is connected to a fourth terminal 8, to which a reference voltage $V_R$ is applied. This reference voltage $V_R$, in a way to be described below, determines the switching threshold of the comparator circuit, and its voltage value is between the potentials of the first terminal 5 and the second terminal 6.

Although it is possible in principle to connect each of the drain terminals of the two n-channel MOSFETs 2 and 4 to the respective corresponding connecting points 10 and 11, it has proved advantageous, because of the then-attainable high electric strength or pronounced voltage endurance, to use high-threshold MOSFETs, in which the existing drain terminal acts as a source terminal and the existing source terminal of each acts as a drain terminal. When such high-threshold MOSFETs are used, the source terminals should be applied to the respective connecting points 10 and 11 of the comparator circuit. Consequently, the drain terminal of the high-threshold MOSFET 2 is connected to the third terminal 7, and the drain terminal of the high-threshold MOSFET 4 is connected to the fourth terminal 8. This is shown in FIG. 2. In this context, high-threshold MOSFETs are understood to be MOSFETs that have as high an electric strength or pronounced voltage endurance as the corresponding power MOSFETs to which the comparator circuit is connected in parallel, as seen in FIG. 1.

Figure 3:
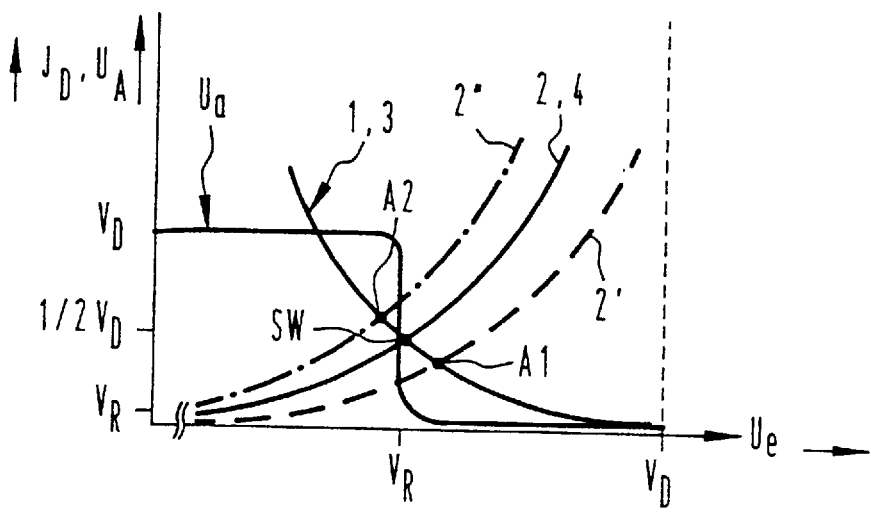
FIG. 3 is a current and voltage graph for the circuit configuration of FIG. 2.

The mode of operation of the integrated comparator circuit shown in FIG. 2 can be described as follows, referring to the current and voltage graph of FIG. 3. It is assumed in this case that according to the invention, each of the MOSFETs 1, 2, 3, 4 of the same channel type are constructed identically. This has the advantage of permitting the use of simple manufacturing technology. The p-channel MOSFETs 1, 3 may be of any arbitrary type and simple logic transistors are also possible. It is expedient to use MOSFETs 1, 2, 3, 4 with the smallest possible dimensions, so that the total current consumption of the comparator circuit does not become excessive.

In accordance with this precondition, the transfer characteristic curves of the MOSFETs 1 and 3 are identical, and those of the MOSFETs 2 and 4 are identical, respectively. Transfer characteristic curves ($U_{GS}/I_D$ for the MOSFETs 1 and 3, and $U_{GS}/I_S$ for the high-threshold MOSFETs 2 and 4 which are preferably "polarized backward") are likewise identified by the numerals 1, 2, 3 and 4 in FIG. 3. A switching threshold SW of the inverter stage is represented by an intersection point of the transfer characteristic curves of the MOSFETs 3 and 4. The switching threshold SW corresponds to the potential of the reference voltage $V_R$ at the terminal 8.

If the input voltage $U_e$ between the terminals 6 and 7 of the comparator circuit is equal to the reference voltage $V_R$ between the terminals 6 and 8, then the connecting point 10 and the connecting point 11 of the comparator circuit are at the same potential, which is dependent on the dimensioning of the individual MOSFETs 1, 2, 3, 4. In the exemplary embodiment of FIG. 3, it is assumed that the connecting points 10, 11 are at approximately half the operating voltage, or in other words are at ½ $V_D$.

Conversely, if the input voltage $U_e$ is greater than the reference voltage $V_R$, then while the transfer curve of the MOSFETs 1, 3 and 4 remains unchanged, the transfer curve of MOSFET 2 shifts to the right, which is indicated by the curve identified by reference numeral 2'. The potential at the connecting point 10 shifts in the direction $V_D$. This makes the MOSFET 4 more strongly conducting, while conversely the conductivity of the MOSFET 3 drops. An output voltage $U_a$ thus drops to the potential $V_R$. On the other hand, if the input voltage $U_e$ is less than the reference voltage $V_R$, then the transfer characteristic curve marked 2" in FIG. 3 results, which is shifted to the left with regard to the transfer characteristic curves 2 and 2'. In that case, the resultant operating point is A2, which is defined by the intersection of the transfer characteristic curve 2" with the transfer characteristic curve 1, 3. In that case, the output voltage $U_a$ is the voltage potential $V_D$ at the terminal 5 of the comparator circuit.

The comparator circuit shown in FIG. 2 makes it possible in a simple way to define the switching threshold SW by way of the choice of the reference potential $V_R$ at the terminal 8. If the reference potential $V_R$ is chosen to be very low, for instance 0.1 V, then with this circuit configuration a comparator circuit with a switching threshold SW at 0.1 V can be achieved. Due to the use of identical MOSFETs of the same channel type, the comparator circuit is independent of temperature and also is not vulnerable to technological variations.

Figure 4:
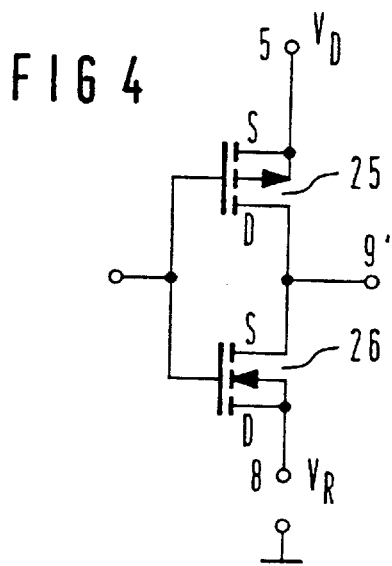
FIG. 4 is a circuit diagram of an inverter stage with complementary MOSFETs, which is connectable on its output side to the integrated comparator circuit of FIG. 2.

FIG. 4 shows a further inverter stage with two complementary MOSFETs 25, 26, which are identical to the MOSFETs 1 and 2 on one hand and 3 and 4 on the other hand, of the comparator circuit shown in FIG. 2. This further inverter stage is preferably connected on the output side to the comparator circuit of FIG. 2. To that end, main current paths of the two MOSFETs 25, 26 are connected between the terminals 5 and 8. Gate terminals of these MOSFETs 25, 26 are to be connected to the terminal 9 of FIG. 2, and a connecting point of the two main current paths of the MOSFETs 25, 26 forms an output terminal 9' of the comparator circuit. The advantage of connecting this further inverter stage of FIG. 4 so that it follows the comparator circuit of FIG. 2 is that the output signal of the comparator circuit at the output terminal 9' corresponds in amount to the deviation of the input voltage $U_e$ from the reference voltage $V_R$. If the input voltage $U_e$ exceeds the reference voltage $V_R$, then an H level can be picked up at the output terminal 9', while if the input voltage $U_e$ undershoots the reference voltage $V_R$, then the output terminal 9' is at the L level. The output voltage at the output terminal 9 or 9' thus swings or deviates if the input voltage $U_e$ deviates from the reference voltage $V_R$. This reaction becomes greater as the number of inverter stages that are connected in series with one another increases. Even though only two series-connected inverter stages are discussed in conjunction with FIGS. 2 and 4, more such inverter stages can also be connected in series with one another.

Figure 5:
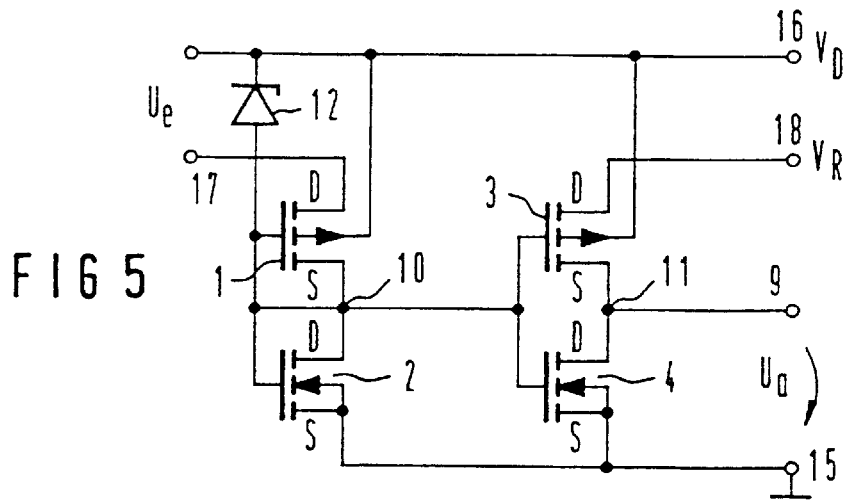
FIG. 5 is a diagram of a second circuit configuration of an integrated comparator circuit according to the invention.

FIG. 5 shows another exemplary embodiment of a circuit configuration for a comparator circuit according to the invention. Unlike the comparator circuit of FIG. 2, this comparator circuit is suitable for detecting an input voltage $U_e$ referred to a positive operating voltage potential, in this case the operating voltage $V_D$, which is applied to a second terminal 16. A first terminal 15 is at a lower potential, in this case zero potential. The MOSFETs 1, 2 and 3, 4 are again connected with their main current paths in series, and they have respective connecting points 10, 11. One terminal of the main current path of the p-channel MOSFET 1 is connected to a third terminal 17 of the comparator circuit and its other terminal is connected to the connecting point 10. A drain terminal of the n-channel MOSFET 2 is likewise connected to this connecting point 10, while a source terminal thereof is connected to the first terminal 15 of. the comparator circuit. Both gate terminals of the MOSFETs 1 and 2 are connected to the connecting point 10. Similarly to FIG. 2, the connecting point 10 is again connected to gate terminals of the complementary MOSFETs 3, 4. One terminal of the main current path of the p-channel MOSFET 3 is applied to a fourth terminal 18 of the comparator circuit, while the other terminal of this MOSFET 3 is connected to the connecting point 11, which at the same time is connected to the output terminal 9. A drain terminal of the n-channel MOSFET 4 is connected to this connecting point 11, while its source terminal is applied to the first terminal 15 of the comparator circuit.

In the exemplary embodiment of FIG. 5, the MOSFETs 1, 3 are of the high-threshold type and are built into the comparator circuit with their drain terminals and their source terminals "polarized backward". To that end, the drain terminal of the MOSFET 1 is connected to the third terminal 17, and its source terminal is connected to the connecting point 10. The drain terminal of the high-threshold MOSFET 3 is connected to the fourth terminal 18 and its source terminal is connected to the connecting point 11. The input voltage $U_e$ is located between the second terminal 16 and the third terminal 17, while the reference voltage $V_R$ is to be applied between the second terminal 16 and the fourth terminal 18. The output signal $U_a$ can be picked up between the terminals 9 and 15.

Figure 6:
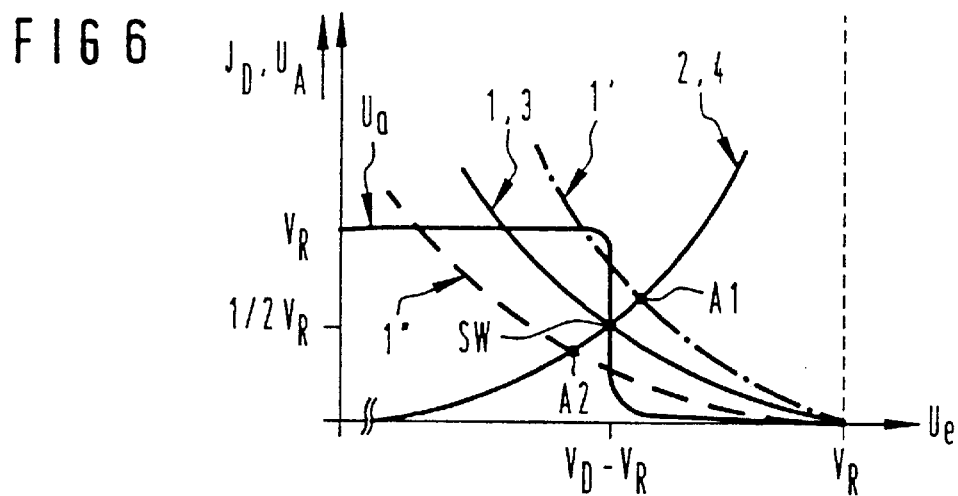
FIG. 6 is a current and voltage graph for the circuit configuration of FIG. 5.

The mode of operation of the comparator circuit shown in FIG. 5 becomes clear from the current and voltage graph of FIG. 6. In accordance with the precondition, the transfer characteristic curves of the two MOSFETs 1 and 3 are identical, and those of the two MOSFETs 2 and 4 are identical, respectively, because of their identical construction. This is clearly shown in FIG. 6 by the transfer characteristic curves 1, 3 and 2, 4. The intersection of these two curves again defines the switching threshold SW of the comparator circuit. If the input voltage $U_e$ is equal to the reference voltage $V_R$, then the transfer characteristic curve of the MOSFET 1 is equivalent to the transfer characteristic curve of the MOSFET 3. In that case, the output voltage $U_a$ is at its resting value, such as ½ $V_R$. The connecting point 10 is at the same potential. It is assumed that in the present case the operating voltage $V_D$ is 10 V and the reference voltage $V_R$ is at 9.9 V, with respect to zero potential. The voltage between the second terminal 16 and the fourth terminal 18 is thus 0.1 V. As long as the input voltage $U_e$ is equal to this 0.1 V, the entire comparator circuit is in the state of repose. If the input voltage $U_e$ between the terminals 16 and 17 becomes less than 0.1 V, then the potential at the terminal 17 rises. The potential at the connecting point 10 thus rises as well, making the MOSFET 4 more strongly conductive and causing the MOSFET 3 to block. The transfer characteristic curve of the MOSFET 1 shifts to the right in terms of the drawing shown in FIG. 4 (see the transfer characteristic curve 1'). An operating point A1 results. The output voltage $U_a$ corresponds to the L level. Conversely, if the input voltage $U_e$, referred to $V_D$, becomes greater, which in this case means greater than 0.1 V, then the potential at the connecting point 10 drops and the MOSFET 3 becomes more strongly conductive while the MOSFET 4 blocks. The reference voltage $V_R$ can be picked up at the output terminal 9 and is thus at the H level (see the transfer characteristic curve 1"). The operating point A2 is the result.

In the comparator circuit of FIG. 5, a Zener diode 12 which is additionally provided is connected by its cathode terminal to the second terminal 16 and by its anode terminal to the connecting point 10. This Zener diode 12 assures that the input voltage $U_e$ can assume an arbitrarily high negative voltage with regard to $V_D$, since the MOSFET 1 is blocked, if the Zener voltage of the Zener diode 12 is surpassed by the input voltage $U_e$. In the circuit configuration of FIG. 5, it is also possible to provide a plurality of downstream inverter stages, which are identical to the inverter stage made up of the complementary MOSFETs 3 and 4.

Figure 7:
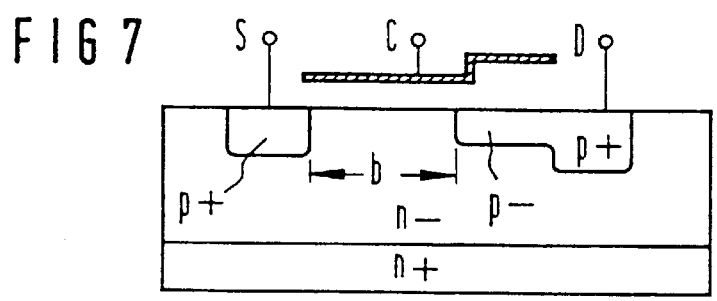
FIG. 7 is a diagrammatic, sectional view of a high-threshold p-channel MOSFET for use in the circuit configuration of FIG. 5.

For the sake of completeness, a sectional view of a high-threshold p-channel MOSFET that is known per se is shown in conjunction with FIG. 7. This MOSFET has an n⁻ substrate, which is provided on its lower surface with an n⁺ layer for a rear-side contact. A substrate terminal of the MOSFET is applied to this rear-side contact. Two p-doped wells are located in an opposite surface of the n⁻ substrate. One of these wells has p⁺ doping and is contacted by a source terminal. Spaced apart from this p⁺ well is a further, larger p-doped well with a similar p⁺ doped region, to which a drain terminal is connected. This p⁺ doped region is adjoined directly by a p⁻ doped region of lesser depth in the direction of the source terminal. The two p-doped wells are spaced apart from one another by a channel length b. Above the channel is a stepped gate electrode, which is joined to the MOSFET by a gate terminal. A high-threshold n-channel MOSFET is similar in construction, but has p-doping instead of the n-doping, and vice versa.

I claim:

1. An integrated comparator circuit comprising:

(a) a first terminal and a second terminal for an operating voltage, said second terminal receiving a positive voltage potential, said first terminal receiving a reference potential lower than said positive voltage potential received by said second terminal;

(b) an input stage having two complementary MOSFETS, said two MOSFETS having main current paths connected in series defining a common connecting point therebetween, and said two MOSFETS having gate terminals connected to said common connecting point;

(c) a third terminal, said series circuit of said MOSFETs being connected between said first terminal and said third terminal;

(d) an inverter stage having two complementary MOSFETs, said two complementary MOSFETs having main current paths connected in series defining a common connecting point therebetween forming an output terminal, and said two complementary MOSFETs having gate terminals connected to said common connecting point of said input stage;

(e) said second terminal and said third terminal receiving an input signal of the comparator circuit;

(f) a fourth terminal for application of a reference potential to determine a switching threshold of the comparator circuit, the reference potential having a level between potentials of said first terminal and said second terminal;

(g) said series circuit of said MOSFETs of said inverter stage being connected between said first terminal and said fourth terminal;

(h) each of said MOSFETs of the same channel type being identical; and (I) a Zener diode connected between said second terminal and said connecting point of said input stage.

2. The integrated comparator circuit according to claim 1, wherein said MOSFET of said input stage having one channel type and being connected to said third terminal and said MOSFET of said inverter stage having the same channel type are high-threshold MOSFETs, and in each of said high-threshold MOSFETs an existing drain terminal is connected as a source terminal and an existing source terminal is connected as a drain terminal.

3. The integrated comparator circuit according to claim 1, wherein the lower reference potential is zero potential.

4. The integrated comparator circuit according to claim 1, including at least one further inverter stage following said inverter stage and having identical MOSFETs being complementary to said MOSFETs of said inverter stage.

5. The integrated comparator circuit according to claim 1, including a plurality of identical inverter stages following said inverter stage and having identical MOSFETs being complementary to said MOSFETs of said inverter stage.

* * * * *